United States Patent
Sha et al.

(10) Patent No.: US 10,281,505 B2
(45) Date of Patent: May 7, 2019

(54) LOW-POWER AND COMPACT VOLTAGE SENSING CIRCUIT

(71) Applicant: DIALOG SEMICONDUCTOR INC., Campbell, CA (US)

(72) Inventors: Qiu Sha, Campbell, CA (US); Andrey Malinin, Campbell, CA (US); Qifeng Shi, Campbell, CA (US); Mingsheng Peng, Campbell, CA (US)

(73) Assignee: DIALOG SEMICONDUCTOR INC., Campbell, CA (US)

( * ) Notice: Subject to any disclaimer, the term of this patent is extended or adjusted under 35 U.S.C. 154(b) by 282 days.

(21) Appl. No.: 15/406,651

(22) Filed: Jan. 13, 2017

(65) Prior Publication Data
US 2018/0203047 A1   Jul. 19, 2018

(51) Int. Cl.
G01R 19/257 (2006.01)
H03K 5/24 (2006.01)
H03M 1/68 (2006.01)
H03M 1/74 (2006.01)

(52) U.S. Cl.
CPC ......... G01R 19/257 (2013.01); H03K 5/2472 (2013.01); H03M 1/68 (2013.01); H03M 1/742 (2013.01)

(58) Field of Classification Search
CPC ...... G01R 19/257; H03M 1/68; H03M 1/742; H03K 5/2472
USPC ...................... 324/120, 76.11, 73.1
See application file for complete search history.

(56) References Cited

U.S. PATENT DOCUMENTS

| | | | | |
|---|---|---|---|---|
| 6,009,421 A | * | 12/1999 | Xie | G06F 11/25 706/61 |
| 6,507,832 B1 | * | 1/2003 | Evans | G06F 11/25 702/182 |
| 2010/0282276 A1 | * | 11/2010 | Kueper | B24B 7/06 134/6 |

* cited by examiner

*Primary Examiner* — Giovanni Astacio-Oquendo
(74) *Attorney, Agent, or Firm* — Haynes and Boone, LLP

(57) ABSTRACT

A voltage sensing circuit for a switching power converter includes a comparator having a comparator input stage that processes a voltage from a main DAC and a current from a tracking DAC.

17 Claims, 4 Drawing Sheets

US 10,281,505 B2

LOW-POWER AND COMPACT VOLTAGE SENSING CIRCUIT

TECHNICAL FIELD

This application generally relates to voltage sensing circuits and, more particularly, to a low-power and compact voltage sensing circuit for a switching power converter.

BACKGROUND

Switching power converters include a controller that controls the cycling of a power switch to regulate the delivery of power to a load. During a constant voltage control mode of operation, the controller controls the power switch cycling responsive to a feedback signal derived from the output voltage delivered to a load. The control loop within the controller may be either an analog control loop or a digital one. In a digital control loop, the feedback signal is processed by a voltage sensing circuit including a comparator that drives a binary output signal responsive to whether the feedback signal is greater than or less than a reference voltage signal produced by a digital-to-analog converter (DAC). Since the comparison of the feedback signal and the reference signal occurs every switching cycle, high accuracy and high speed voltage sensing requires a fast comparator and a high resolution DAC.

An example voltage sensing circuit 100 is shown in FIG. 1. To generate the reference signal, a main DAC such as a 9-bit DAC 110 converts a main DAC input signal (D<8:0>) into a main analog output signal. To increase the DAC resolution, a tracking DAC such as a 5-bit DAC 115 generates a tracking analog output signal that is added with the main analog signal in an adder 120 to form an analog reference signal received by a comparator 105 at its positive input. Comparator 105 also receives the voltage feedback signal Vsense at its negative input. A comparator output signal (comp_out) will thus be binary high so long as the analog reference signal is greater than the voltage feedback signal and will be a binary zero signal so long as the voltage feedback signal is greater than the analog reference signal.

It is conventional to form adder 120 using a high-gain and high-bandwidth operational amplifier (op-amp), which requires considerable die area and consumes substantial amounts of current. Accordingly, there is a need in the art for improved voltage sensing circuits having improved density and reduced power consumption.

SUMMARY

To address the need in the art for increased density and reduced power consumption, a voltage sensing circuit is provided in which the comparator is adapted to also add the analog output signals from the main DAC and the tracking DAC. The resulting voltage sensing circuit is quite advantageous in that the conventional requirement for a high-gain and high-bandwidth operational amplifier for adding the DAC output signal prior to the comparison by the comparator is eliminated, which significantly increases density and reduces the power consumption for the resulting voltage sensing circuit.

These and additional advantageous features may be better appreciated through a consideration of the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To eliminate the need for a separate operational amplifier to add the DAC output signals in a voltage sensing circuit, a comparator is provided that includes a comparator input stage including a differential pair of transistors. A source for a first one of the differential pair transistors couples to a current source through a first resistor. Similarly, a source for a second one of the differential pair transistors couples to the current source through a second resistor, wherein the first resistor and the second resistor are matched.

A main DAC, a tracking current digital to analog converter (iDAC), and a feedback voltage signal drive the comparator input stage. The tracking iDAC generates an analog tracking current (Iidac) responsive to the analog conversion of a tracking input word for the tracking iDAC. Depending upon the sign of the tracking input word, the tracking iDAC either sources the analog tracking current Iidac from the source of the first differential pair transistor or from the source of the second differential pair transistor. The current source generates a current source current from which Iidac is subtracted at the source for the differential pair transistor selected by the sign of the tracking input word. The main DAC generates a main DAC analog output voltage responsive to the analog conversion of a main DAC input word. A remaining portion of the current source current is steered between the differential pair transistors depending upon the difference between the main DAC analog output voltage signal and the voltage feedback signal.

Figure 1:
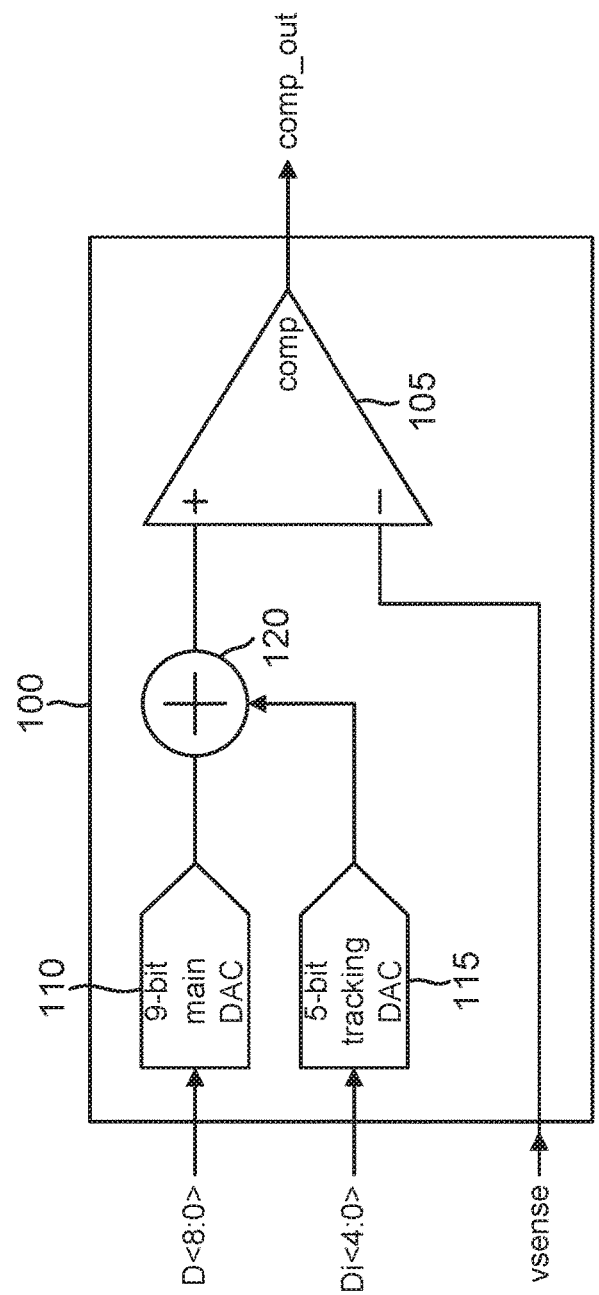
FIG. 1 is a circuit diagram of a conventional voltage sensing circuit.
Figure 2:
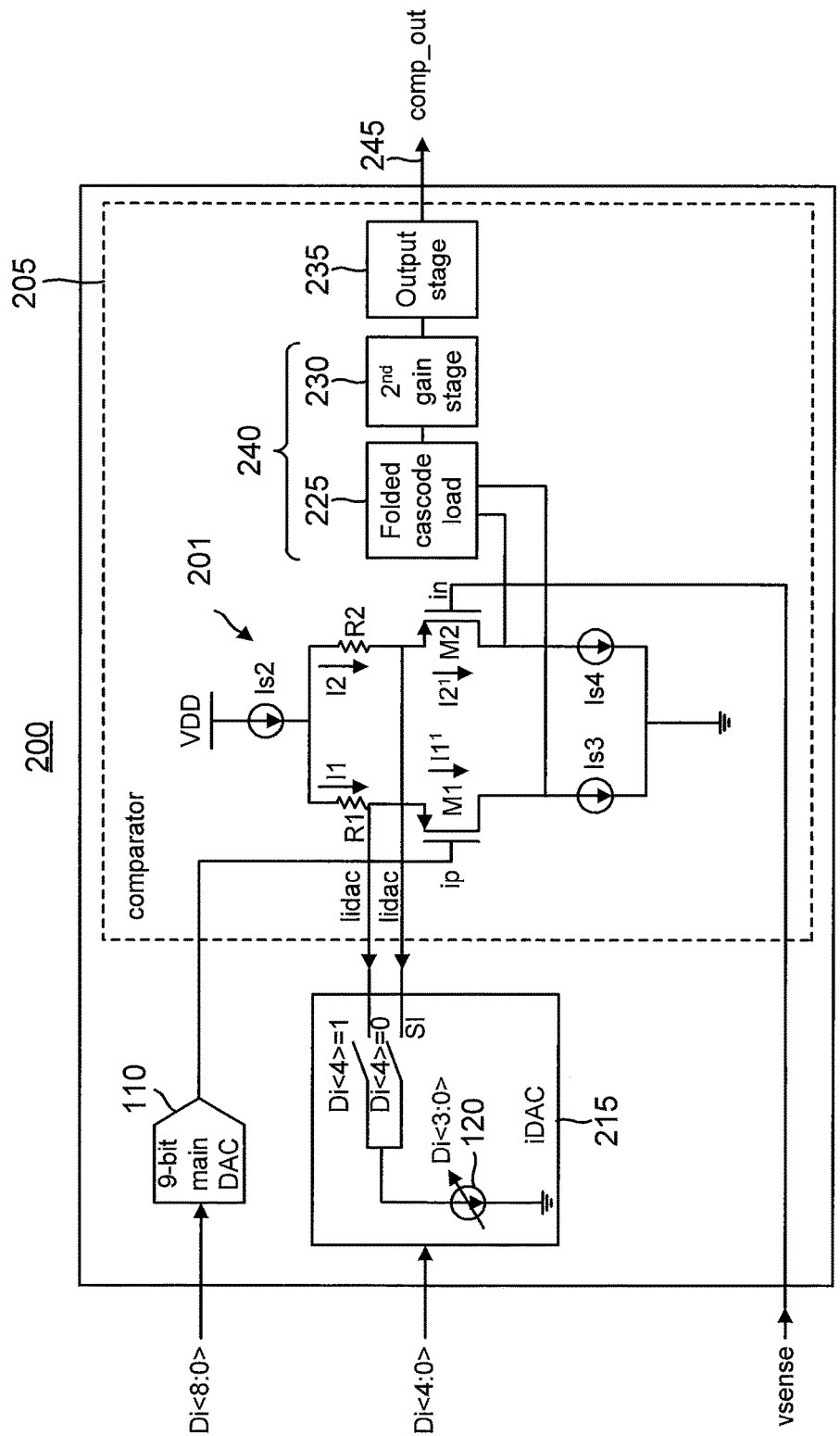
FIG. 2 is a circuit diagram of a voltage sensing circuit in accordance with an embodiment of the disclosure in which the capacitor input stage includes a differential pair of PMOS transistors.

An example voltage sensing circuit 200 is shown in FIG. 2. A 9-bit main DAC 110 functions to convert a main DAC input word D<8:0> into a main DAC analog output voltage (ip). It will be appreciated that the digital width of the DACs disclosed herein is merely exemplary and may be readily modified in alternative embodiments. A 5-bit current tracking DAC (iDAC) 215 receives a 5-bit tracking word Di<4:0>. One of the bits in the 5-bit tracking word Di<4:0> functions as a sign bit to control a double-throw switch S1. For example, if bit Di<4> is a binary one, switch S1 selects for its upper throw. Conversely, if bit Di<4> is a logic zero, switch S1 selects for its lower throw. The remaining bits in Di<3:0> control a current source 120 coupled between switch S1 and ground to generate an analog current Iidac.

The main DAC analog output voltage ip is received at a gate of a first PMOS differential pair transistor M1 in a comparator input stage 201 within a comparator 205. The feedback voltage Vsense drives a gate of a second PMOS differential pair transistor M2. The drain of transistor M1 is biased by a current source Is3 that couples between ground and the drain of transistor M1. Similarly, the drain of transistor M2 is biased by a current sourced Is4 that couples between ground and the drain of transistor M2. The drains of differential pair transistors M1 and M2 form a pair of output nodes for comparator input stage 201.

The source of differential pair transistor M1 couples through a resistor R1 to a current source Is2 that is powered by a power supply node supplying a power supply voltage VDD. Similarly, the source of differential pair transistor M2 couples through a resistor R2 to current source Is2. The upper throw of switch S1 couples to the source of differential pair transistor M1. Thus, when bit iD<4> is a binary one (indicating that 5-bit tracking word iD<4:0> has a positive sign), the current Iidac is sourced from the source of differential pair transistor M1. Similarly, when bit iD<4> is a binary zero (indicating that 5-bit tracking word iD<4:0> has a negative sign), the current Iidac is sourced from the source of differential pair transistor M2. A current I1 that flows through resistor R1 (which is matched to resistor R2 just like differential pair transistor M1 is matched to differential pair transistor M2) would equal a current I1' that flows through differential pair transistor M1 if bit iD<4> is a binary zero. Similarly, a current I2 that flows through resistor R2 would equal a current I2' that flows through differential pair transistor M2 if bit iD<4> were a binary one.

Note that comparator input stage 205 would be a conventional comparator input stage if iDAC 215 were removed and the analog voltage ip resulted from the addition of the analog voltages resulting from the analog conversion of the main DAC input word and the tracking iDAC input word. Since the tracking iDAC is absent, the current I1 equals I1'. Similarly, the current I2 equals I2'. In such a conventional comparator input stage the difference between voltages ip and in may be expressed as:

$$ip\text{-}in = VGS1' - VGS2' - (I1' - I2')*R \qquad \text{Eq. (1)}$$

where R is the resistance of R1 (which equals R2) and VGS1' and VGS2' are the gate-to-source voltages of differential pair transistors M1 and M2, respectively for the conventional input comparator. Referring again to comparator input stage 201, current I1 may be expressed as:

$$I1 = I1' + \text{Iidac}*Di\text{<}4\text{>} \qquad \text{Eq. (2)}$$

Similarly, I2 may be expressed as:

$$I2 = I2' + \text{Iidac}*\text{complement}(Di\text{<}4\text{>}) \qquad \text{Eq. (3)}$$

The difference between equations (2) and (3) leads to:

$$I1 - I2 = I1' - I2' + \text{sign}*\text{Iidac} \qquad \text{Eq. (4)}$$

where sign=1 if Di<4>=1 and sign=−1 if Di<4> is 0. From comparator input stage 201, it may be shown that:

$$ip\text{-}in = VGS1 - VGS2 - ((I1 - I2)*R) \qquad \text{Eq. (5)}$$

where VGS1 and VGS2 are the gate-to-source voltages for differential pair transistors M1 and M2, respectively. Since transistor M1 and M2 are identical devices such that their transconductance may be represented as gm, the preceding equations lead to:

$$ip\text{-}in = ((VGS1' - VGS2') - \text{sign}*\text{Iidac}/gm) - ((I1' - I2' + \text{sign}*\text{Iidac})*R) \qquad \text{Eq. (6)}$$

Equation (6) may be rearranged as follows:

$$(ip + \text{sign}*\text{Iidac}(1/gm + R)) - in = VGS1 - VGS2 - (I1 - I2)*R \qquad \text{Eq. (7)}$$

Note that the right side of equation (7) is the same response for a conventional input comparator as shown by the right side of equation (1). The left hand side of equation (7) is thus showing the addition of Ip and a factor proportional to Iidac. This is quite advantageous in that the response of comparator input stage 201 with regard to driving the drains of differential pair transistors M1 and M2 is the same as would be at the drains of the same transistors in a conventional comparator input stage. Yet this addition is performed in input comparator stage 201 without the need for another operational amplifier to add the main DAC and tracking DAC analog output signals. Those of ordinary skill in the art will appreciate that the value of current sources Is2, Is3, and Is4 are selected to maximize the speed of operation for comparator input stage 201.

The remainder of comparator 205 may be conventional. In that regard, a comparator will typically comprise a comparator input stage, a gain stage, and an output stage. In comparator 205, a gain stage 240 is formed using an active folded cascode load 225 and a second gain stage 230. An output stage 235 may comprise a series of inverters to buffer the comparator output signal.

Figure 3:
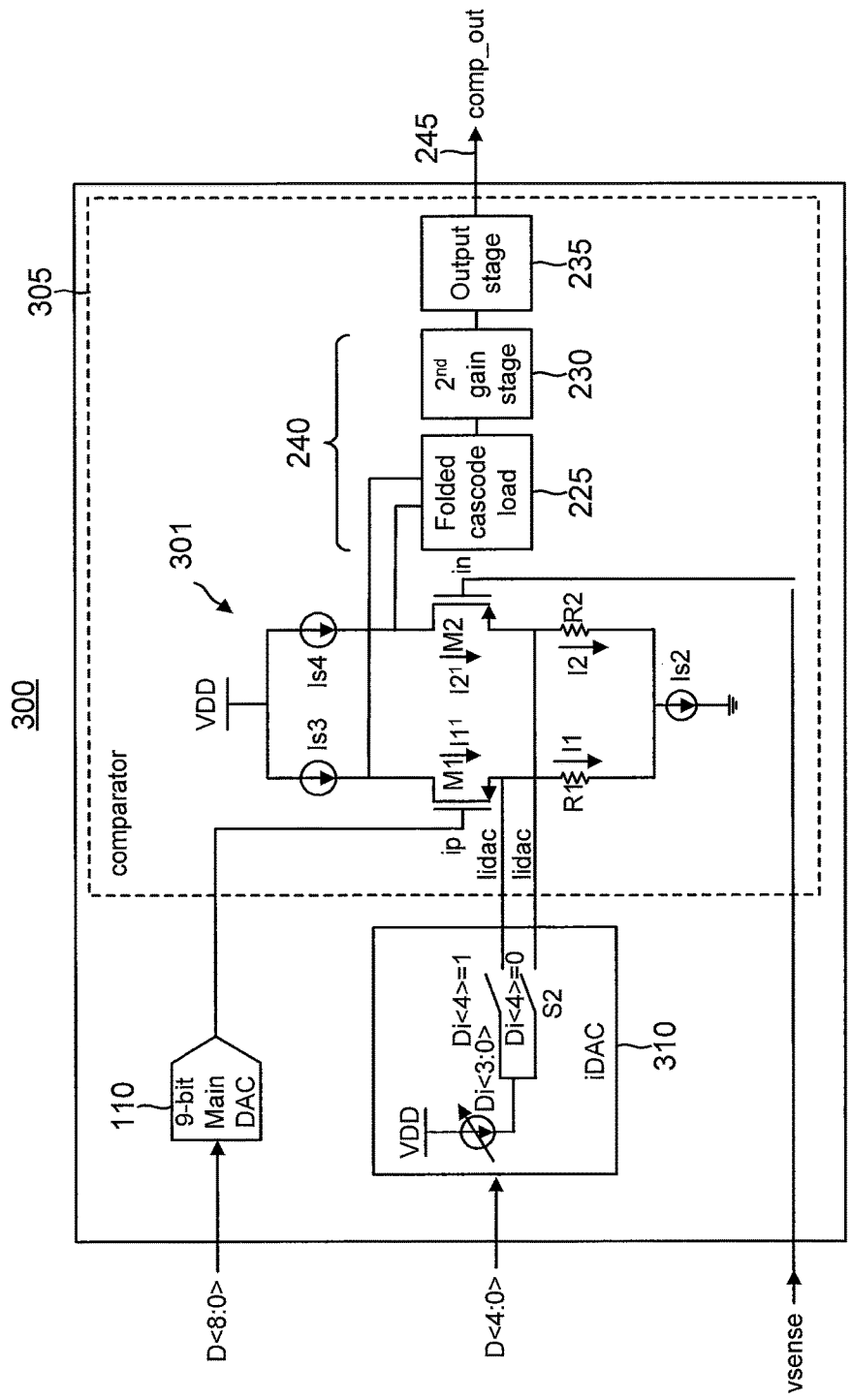
FIG. 3 is a circuit diagram of a voltage sensing circuit in accordance with an embodiment of the disclosure in which the capacitor input stage includes a differential pair of NMOS transistors.

An alternative voltage sensing circuit 300 is shown in FIG. 3. A comparator 305 includes a folded cascode load 225, a second gain stage 230, and an output stage 235 as discussed with regard to voltage sensing circuit 200. But comparator input stage 201 is replaced by an NMOS differential pair comparator input stage 301 that includes an NMOS differential pair transistor M1 and an NMOS differential pair transistor M2. The gate of transistor M2 is driven by the feedback voltage Vsense whereas the gate of M1 is driven by the analog output of main DAC 110. A tracking current DAC (iDAC) 310 includes a current source responsive to Di<3:0> to drive a tracking current into one of the sources of transistors M1 and M2 as selected by a double throw switch S2. As discussed with regard to switch S1, the binary value of input bit Di<4> controls which throw is selected (and hence which source of transistors M1 and M2 that will receive the current Iidac. The sources of transistors M1 and M2 couple through matched resistors R1 and R2, respectively, to current source Is2. Current source Is2 sources its current into ground. The drains of transistors M1 and M2 couple through current sources Is3 and Is4, respectively to the power supply node. Comparator input stage 301 is thus the NMOS complement of comparator input stage 201.

Figure 4:
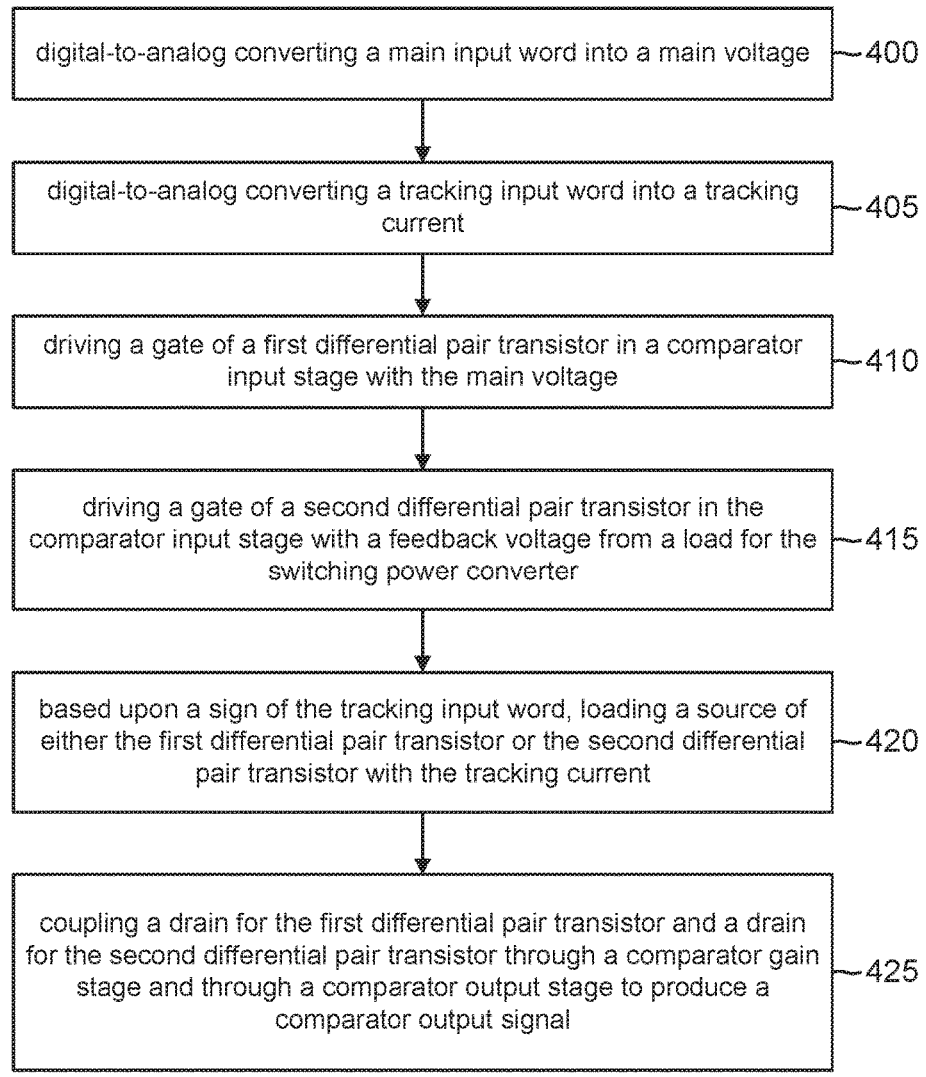
FIG. 4 is a flowchart for a method of operation for a voltage sensing circuit in accordance with an embodiment of the disclosure.

A method of operation for a voltage sensing circuit will now be discussed with reference to the flowchart of FIG. 4. The method includes an act 400 of digital-to-analog converting a main input word into a main voltage. The conversion in main DAC 110 is an example of act 400. In addition, the method includes an act 405 of digital-to-analog converting a tracking input word into a tracking current. The conversion in iDAC 215 or 310 is an example of act 405. The method also includes an act 410 of driving a gate of a first differential pair transistor in a comparator input stage with the main voltage. The driving of PMOS differential pair transistor M1 in comparator input stage 201 or of its NMOS analog in comparator input stage 301 is an example of act 410. In addition, the method includes an act 415 of driving a gate of a second differential pair transistor in the comparator input stage with a feedback voltage from a load for the switching power converter. The driving of the gate of the PMOS differential pair transistor M2 with Vsense in comparator input stage 201 or its NMOS analog in comparator input stage 301 is an example of act 415. Moreover, the method includes an act 420 of, based upon a sign of the tracking input word, loading a source of either the first differential pair transistor or the second differential pair transistor with the tracking current. The selection of a source for the Iidac current loading through double throw switch S1 or S2 is an example of act 420. Finally, the method includes an act 425 of coupling a drain for the first differential pair transistor and a drain for the second differential pair transistor through a comparator gain stage and through a comparator output stage to produce a comparator output signal. The amplification through comparator gain stage 240 and output stage 235 is an example of act 425.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A voltage sensing circuit for a switching power converter, comprising:
   a main digital-to-analog converter (DAC) configured to convert a main input word into an output voltage;
   a current DAC configured to convert a tracking input word into a tracking current;
   a comparator input stage including a differential pair of transistors, wherein a feedback voltage for the switching power converter drives a gate of a first differential pair transistor in the differential pair and the output voltage signal drives a gate of a second differential pair transistor in the differential pair, wherein the current DAC includes a double throw switch having a first throw coupled to a source of the first differential pair transistor and having a second throw coupled to a source of the second differential pair transistor;
   a comparator gain stage coupled to a drain of the first differential pair transistor and to a drain of the second differential pair transistor; and
   a comparator output stage configured to receive an output signal from the comparator gain stage and to provide a comparator output signal representing a binary comparison between a sum of the output voltage and a tracking DAC voltage proportional to the tracking current and the feedback voltage for the switching power converter.

2. The voltage sensing circuit of claim 1, wherein the first differential pair transistor is a PMOS first differential pair transistor and the second differential pair transistor is a PMOS second differential pair transistor.

3. The voltage sensing circuit of claim 2, further comprising a first current source configured to drive a current into the source of the PMOS first differential pair transistor through a first resistor and to drive a current into the source of the PMOS second differential transistor through a second resistor that is matched to the first resistor.

4. The voltage sensing circuit of claim 1, wherein the double throw switch is configured to be controlled by a sign of the input tracking word with regard to a selection of the first throw or the second throw.

5. The voltage sensing circuit of claim 1, wherein the comparator gain stage includes a folded cascode load.

6. The voltage sensing circuit of claim 1, wherein the comparator output stage comprises a series of inverters.

7. The voltage sensing circuit of claim 1, wherein the first differential pair transistor is an NMOS first differential pair transistor and the second differential pair transistor is an NMOS second differential pair transistor.

8. The voltage sensing circuit of claim 7, further comprising a first current source configured to source a current from the source of the NMOS first differential pair transistor through a first resistor and to source a current from the source of the NMOS second differential transistor through a second resistor that is matched to the first resistor.

9. The voltage sensing circuit of claim 8, further comprising a second current source coupled between the drain of the NMOS first differential pair transistor and a power supply node.

10. The voltage sensing circuit of claim 9, further comprising a third current source coupled between the power supply node and the drain of the NMOS second differential pair transistor.

11. A method of voltage sensing in a switching power converter, comprising:
    digital-to-analog converting a main input word into a main voltage;
    digital-to-analog converting a tracking input word into a tracking current;
    driving a gate of a first differential pair transistor in a comparator input stage with the main voltage;
    driving a gate of a second differential pair transistor in the comparator input stage with a feedback voltage from a load for the switching power converter;
    based upon a sign of the tracking input word, loading a source of either the first differential pair transistor or the second differential pair transistor with the tracking current;
    coupling a drain for the first differential pair transistor and a drain for the second differential pair transistor through a comparator gain stage and through a comparator output stage to produce a comparator output signal.

12. The method of claim 11, further comprising biasing a drain of the first differential pair transistor with a current from a first current source.

13. The method of claim 12, further comprising biasing a drain of the second differential pair transistor with a current from a second current source.

14. The method of claim 13, further comprising steering a current from a third current source between the first differential pair transistor and the second differential pair transistor responsive to a difference between the main voltage and the feedback voltage.

15. The method of claim 11, wherein the comparator output signal is responsive to a binary comparison between a sum of the main voltage and a tracking voltage proportional to the tracking current and the feedback voltage.

16. The method of claim 11, wherein a width for the main input word is greater than a width for the tracking input word.

17. The method of claim 16, wherein the main input word is at least 9 bits wide and wherein the tracking input word is at least 5 bits wide.

* * * * *